United States Patent
Belet

(10) Patent No.: US 9,417,288 B2
(45) Date of Patent: Aug. 16, 2016

(54) PROCESS FOR AUTO-TESTING A FULLY DISCHARGED BATTERY, SUCH AS DOUBLE-LAYER CAPACITOR BATTERY, AND CIRCUIT FOR DOING THE SAME

(75) Inventor: Christophe Belet, Parigne L'eveque (FR)

(73) Assignee: ST-Ericsson SA, Plan-les-Ouates (CH)

( * ) Notice: Subject to any disclaimer, the term of this patent is extended or adjusted under 35 U.S.C. 154(b) by 657 days.

(21) Appl. No.: 13/819,377

(22) PCT Filed: Aug. 31, 2011

(86) PCT No.: PCT/EP2011/004374
§ 371 (c)(1),
(2), (4) Date: Feb. 27, 2013

(87) PCT Pub. No.: WO2012/028304
PCT Pub. Date: Mar. 8, 2012

(65) Prior Publication Data
US 2013/0154655 A1    Jun. 20, 2013

(30) Foreign Application Priority Data

Aug. 31, 2010 (EP) .................................... 10368035
Oct. 15, 2010 (EP) .................................... 10368040

(51) Int. Cl.
*G01N 27/416* (2006.01)
*G01R 31/36* (2006.01)
(Continued)

(52) U.S. Cl.
CPC .......... *G01R 31/36* (2013.01); *G01R 19/16542* (2013.01); *G01R 31/362* (2013.01); *G01R 31/3637* (2013.01); *H02J 7/0047* (2013.01)

(58) Field of Classification Search
CPC .. G01R 31/36; G01R 31/362; G01R 31/3637; G01R 19/16542; H02J 7/0047

USPC .................................................. 324/426, 433
See application file for complete search history.

(56) References Cited

U.S. PATENT DOCUMENTS 3,932,797 A    1/1976 York
4,251,811 A    2/1981 Wittlinger
(Continued)

FOREIGN PATENT DOCUMENTS

DE    19828560 A1    1/2000
GB    2259615    *    3/1993
(Continued)

OTHER PUBLICATIONS

Feng, W. et al., "Research on the charge mode of series-connected batteries," IEEE Vehicle Power and Propulsion Conference, Sep. 3, 2008, Harbin, China, IEEE, USA.
(Continued)

*Primary Examiner* — Nathaniel Pelton
(74) *Attorney, Agent, or Firm* — Coats & Bennett, P.L.L.C.

(57) ABSTRACT

A process for performing an auto-test of a fully discharged battery (130) of an electronic appliance including a battery charger (160), said process involving the steps of: performing (210) an initialization phase; charging (220) said battery (130) with a predetermined constant current during a predefined period allowing stabilization of said current (Icurrent); detecting (230) the voltage of said battery after said predefined period, said battery being still in charge; testing (240) whether said sensed voltage is comprised within a predetermined range of threshold values (V1, V2), and reporting a battery failure when said sensed value is outside said range. The invention is particularly adapted to the auto-test of a backup battery made of Electric double layer capacitors or any fully discharged backup battery.

12 Claims, 5 Drawing Sheets

(51) Int. Cl.
*G01R 19/165* (2006.01)
*H02J 7/00* (2006.01)

(56) References Cited

U.S. PATENT DOCUMENTS

| | | | |
|---|---|---|---|
| 5,458,991 A | 10/1995 | Severinsky | |
| 5,465,039 A * | 11/1995 | Narita et al. | 320/164 |
| 5,861,729 A * | 1/1999 | Maeda et al. | 320/106 |
| 6,351,130 B1 | 2/2002 | Preiser et al. | |
| 6,424,156 B1 * | 7/2002 | Okamura | 324/426 |
| 2008/0111521 A1 * | 5/2008 | So et al. | 320/137 |
| 2010/0039116 A1 * | 2/2010 | Tsenter et al. | 324/427 |
| 2010/0315089 A1 | 12/2010 | Rapich | |
| 2011/0112782 A1 * | 5/2011 | Majima et al. | 702/63 |

FOREIGN PATENT DOCUMENTS

| | | |
|---|---|---|
| GB | 2259615 A | 3/1993 |
| JP | 11273751 A | 10/1999 |
| JP | WO/2010/004985 * | 1/2010 |
| WO | 03048796 A1 | 6/2003 |
| WO | 2008056316 A1 | 5/2008 |

OTHER PUBLICATIONS

Zhang, Z. et al., "Storage Battery Performance Testing System Controlled by 8098 Chip Microcomputer," Proceedings of the IEEE International Symposium, May 25, 1992, pp. 598-601, Xian, China, IEEE, USA.

Miyazaki, T. et al., "Intelligent Battery System for Fiber in the Loop," Telecommunications Energy Conference, Oct. 4, 1992, pp. 112-116, Washington, D.C., IEEE, USA.

Gizopoulos, D. et al., "Low Power/Energy BIST Scheme for Datapaths," VLSI Test Symposium Proceedings, Apr. 30, 2000, pp. 23-28, Montreal, Quebec, Canada, IEEE Computer Society, USA.

* cited by examiner

PROCESS FOR AUTO-TESTING A FULLY DISCHARGED BATTERY, SUCH AS DOUBLE-LAYER CAPACITOR BATTERY, AND CIRCUIT FOR DOING THE SAME

TECHNICAL FIELD

The present invention relates to the field of electronics circuits and more particularly to a process for performing an auto-test of a fully discharged battery, such as a backup battery made of an Electric double-layer capacitor.

BACKGROUND ART

Nowadays, a plurality of electronic devices such as mobile phones, tablet PC or in general embedded devices use a backup battery which, as known by a skilled man is a secondary power supply that provides power to electronic devices in the absence of main power supplies. In particular, the backup battery is used to prevent losing sensitive information when the device is no more supplied by a main power supply, such as, for instance, real time clock data.

Conventional batteries used for embodying backup batteries are based on Ni-Cad and Lithium-Ion.

Also conventionally, electronic products manufacturers perform production tests to ensure that any of the components of a product operate properly after their assembly, and this also applies to the particular backup battery included in the product.

The most common method for performing a production test is the visual method that carries out a visual test for detecting the presence of the product components. Such visual test can applied, either manually by a human person or automatically by using automated optical inspection.

In order to make the production tests more reliable and faster, the trend is to involve more and more automation in production tests and thus generalizes the development of automated optical inspection applied to the PCB (Printed Circuit Board) during the manufacturing process, e.g. by means of a camera capturing the PCB image from the side of the PCB where components are being assembled. The inspection machine scans the PCB image in order to detect if all components are present and well placed.

Such method has been used also for checking the presence of the backup battery. However, the visual method—be it manual or automatic—shows limitation since it is not appropriate to detect proper soldering of the components or, even, proper working of the latter.

In order to further increase the reliability on checking the functionality of a product component as well as to decrease the duration of the testing process, more and more manufacturers integrate within the internal circuits forming part of an electronic product a specific circuit for achieving what is called auto-test (self-test) capability.

Accordingly, such electronic products have a capability to auto-test the functionalities of their components by themselves. In that respect, if a backup battery is included in one electronic product that supports auto-test capability, its functionality can be tested automatically.

One known auto-testing technique for detecting the functionality of an electronic product component and particularly of a backup battery, is the performance of a voltage measurement, which is achieved by the internal and General Purpose Analog-to-Digital Converter (GPADC) which is generally present in recent power management unit (PMU).

Such conventional auto-test method is illustrated in FIG. 1, showing an electronic product or appliance 10 which includes a Power Management Unit 20 to which is connected one battery 30, e.g. a backup battery 30. The Power Management unit 20 further includes a detecting block 40 which senses the voltage of the battery, plus a battery charger 50 and a General Purpose ADC converter 60 having access to all analog voltages present in the circuit for the purpose of converting them into the digital representation forwarded to a (not known) processor.

Particularly, GPADC 60 is used for measuring the voltage of the backup battery 30 in order to check its presence . . . .

a) Lithium-Ion or Ni-Cad Backup Batteries

The auto-test is traditionally applied to the Lithium-Ion and the Ni-Cad battery since it allows to achieve very fast testing. Indeed, Lithium-Ion or Ni-Cad backup batteries are never fully discharged and they have a minimum voltage guaranteed by the backup battery manufacturer. Consequently, during the manufacture of an electronic product including a Lithium-Ion or Ni-Cad backup battery, the test of a fully operative Lithium-Ion battery can simply be based on the checking of the voltage generated by such battery without any preliminary need to charge the latter. More particularly, If the measured backup battery voltage is between expected voltage thresholds the auto-test succeeds and thus the backup battery is presumed to properly operate and to be well soldered. Otherwise the auto-test fails.

Therefore, auto-test process, when applied to Lithium-Ion and/or Ni-Cad backup batteries, can be achieved in less than 1 ms.

b) Electric Double-Layer Capacitors

The most recent of the above mentioned backup battery technologies is the electric double-layer capacitor, also designated as being a GoldCap backup battery. It includes an electrochemical capacitor that has an unusual high energy density compared to common capacitors. Also, its manufacture cost is less than Lithium-Ion and Ni-Cad backup batteries.

The problem lies on the fact that the known auto-test process described above, can not be achieved in less than 1 ms.

Indeed, as known by the skilled man, an electric double-layer capacitor, in contrast with the Lithium-Ion or Ni-Cad backup batteries, is always discharged and its voltage is 0V. Consequently, the checking of the presence of a voltage on such a backup battery can not directly and immediately be performed, as for the Lithium-ion battery, just after the soldering operation, since a preliminary charging operation of the battery is required.

Such compulsory charging might take at least several hundreds of milliseconds, what would significantly impact the time for manufacturing the product and, eventually, jeopardize the productivity.

Indeed, considering for instance the flowchart of FIG. 2, there is described the adaptation of the auto-test process—known to the Lithium-Ion—for the new electric double-layer capacitor:

Phase I: initialization of the auto-test software

Phase II: charging of the backup battery during a period sufficient for entailing a first increase of the voltage of the battery, e.g. at least 500 ms Phase III: performance of voltage stabilization that lasts for ~100 ms Phase IV: stop charging and measure the backup battery voltage, for instance by means of the General Purpose ADC convertor.

At the end of phase IV, if the measured backup battery voltage shows to be between the expected voltage thresholds the auto-test succeeds and thus the backup battery (in that case the electric double-layer capacitor) is presumed to be well soldered and operative. Otherwise, the auto-test fails.

The completion of the known auto-test process, when applied to those GoldCap battery, has required not less than 600 ms, what is significantly higher than the period required for testing Lithium-Ion and Ni-Cad battery.

Therefore, the application of the conventional auto-test process of FIG. 2 is not appropriate for electric double-layer capacitors or GoldCap batteries since it requires to much time.

There is a wish for an alternative auto-test which is more adapted to the new type of fully discharged backup batteries and which additionally provides more accurate test results.

SUMMARY OF THE INVENTION

It is an object of the present invention to provide an auto-test process which is well adapted to fully discharged backup batteries—such as electric double-layer capacitors.

It is another object of the present invention to provide an auto-test process requiring very short processing time even in the case of electric double-layer capacitors or batteries being fully discharged when mounted and soldered on a PCB.

It is still a further object of the present invention to achieve an auto-test process which improves the accuracy of the auto-test by means of checking more deeply the internal working of the battery.

It a still another object to achieve an auto-test of a backup battery which can still be used for more conventional Lithium-Ion or Ni-Cad backup batteries.

These and other objects of the invention are achieved by a process for performing an auto-test of a fully discharged battery, the process involving the steps of:
performing an initialization phase;
charging the backup battery with a predetermined constant current during a predefined period allowing stabilization of said current (Icurrent);
detecting the voltage of the backup battery after the predefined period, when the battery is still being charged;
testing whether said sensed voltage is comprised within a predetermined range of threshold values, and
reporting a battery failure when said sensed value falls outside the range.

Preferably, the backup battery is a electric double-layer capacitor used as a backup battery, and the process takes full advantage of the high impedance of such battery for the purpose of producing a sensed voltage which can provide a clear information about the status of that battery.

Moreover, the testing can be performed in a very short period, for instance less than 1 ms . . . .

In one embodiment, the process is executed by a processor which receives a digital representation of the sensed voltage by means of a General Purpose Analog-to-Digital Converter.

In one embodiment, the GPADC is included into a Power Management Unit.

In one embodiment, the process can even be performed for the purpose of testing more conventional backup batteries, such as Lithium-Ion or Nickel Cad battery. In that case, the initialization phase is immediately followed by a preliminary detection of the voltage of the battery, prior to any charging, so as to generate a preliminary voltage Vsoc. The test is then applied on the difference between the value of the voltage sensed after the predefined period (1 ms) and the preliminary voltage Vsoc, so as to yield an accurate information on the impedance of the backup battery.

The invention also achieves a circuit for performing an auto-test of a fully discharged battery of an electronic appliance including a battery charger.

The circuit comprises:
means for performing an initialization phase;
means for charging the backup battery with a predetermined constant current during a predefined period allowing stabilization of the current (Icurrent);
means for detecting the voltage of said battery after said predefined period, said battery being still in charge;
means for testing whether said sensed voltage is comprised within a predetermined range of threshold values, and
means for reporting a battery failure when said sensed value is outside said range.

Preferably, the backup battery is a electric double-layer capacitor used as a backup battery and the predefined period is set to approximately 1 ms.

DESCRIPTION OF THE DRAWINGS

Other features of one or more embodiments of the invention will be best understood by reference to the following detailed description when read in conjunction with the accompanying drawings.

DESCRIPTION OF THE PREFERRED EMBODIMENT

There will now be described one particular embodiment of a process which is perfectly adapted to the more recent backup batteries which are batteries showing full discharge after the manufacturing process.

More particularly, the description will be considered with the use of a backup battery being an electric double-layer capacitor; but clearly, the skilled man will adapt the process below to any other kind of batteries which are fully discharged when soldered or mounted on a PCB. More generally, it will be apparent to the skilled man that the process can also be applied to any type of backup battery, including the well-known Lithium-Ion and Ni-Cad, which can also take advantage of the higher accuracy of the process which will be described below.

As recalled above, the electric double-layer capacitors are fully discharged when manufactured and thus, a time period of charging and voltage stabilization (at least 600 ms) would be required when applying the conventional auto-test process which is applied for Lithium-Ion.

The invention manages to significantly decrease the above mentioned charging period to approximately 1 ms. This is achieved by taking advantage of the very high internal impedance shown by the electric double-layer capacitors (~100 Ohms) compared to more conventional batteries (e.g. Lithium-Ion and Ni-Cad batteries), such impedance being measured directly after the start of a charging process, as described hereinafter.

Figure 1:
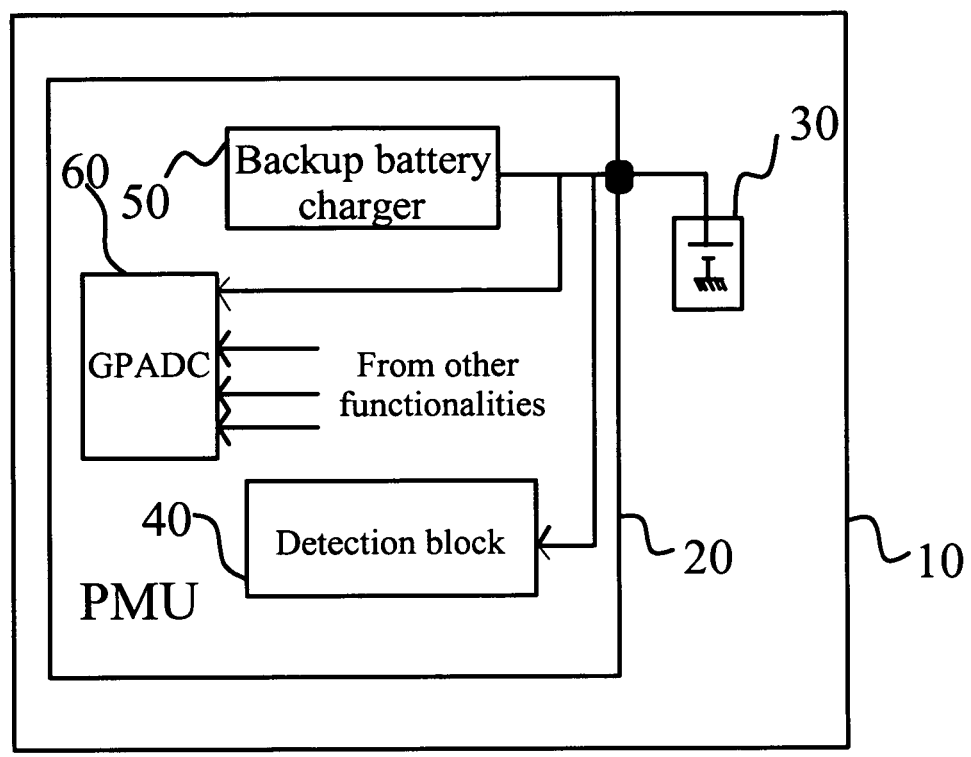
FIG. 1 illustrates the prior art architecture of a product performing ADC auto-test.
Figure 2:
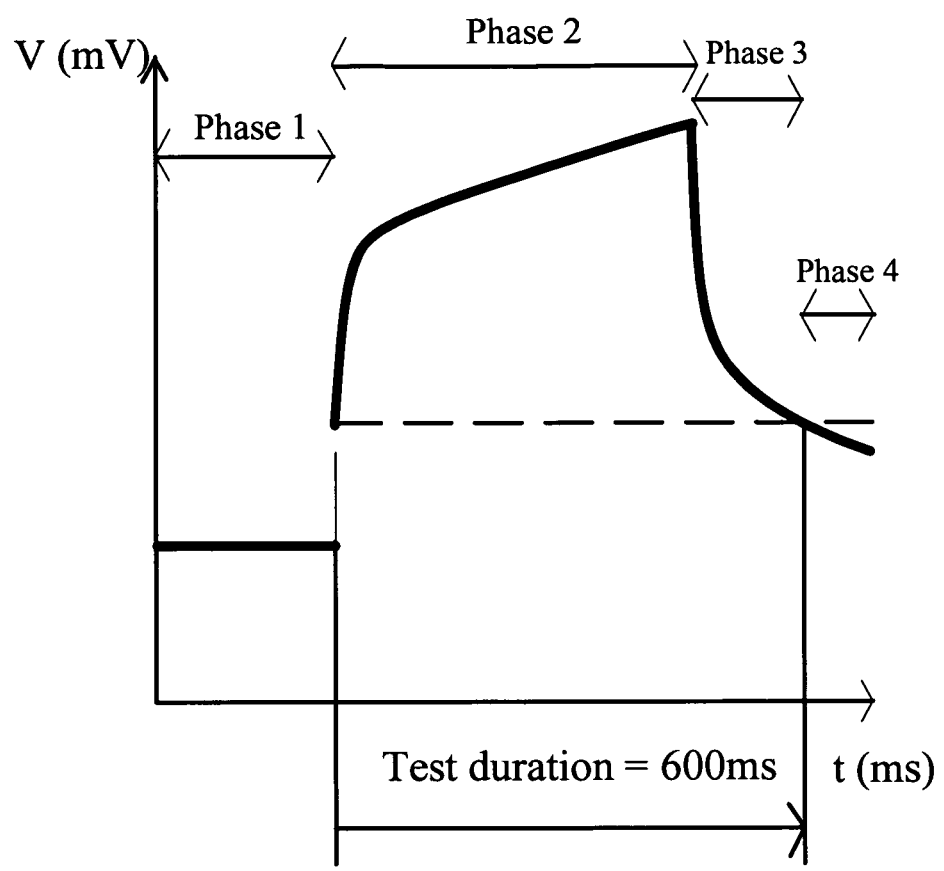
FIG. 2 illustrates the application of the conventional auto-test process on a an electric double-layer capacitor.
Figure 3:
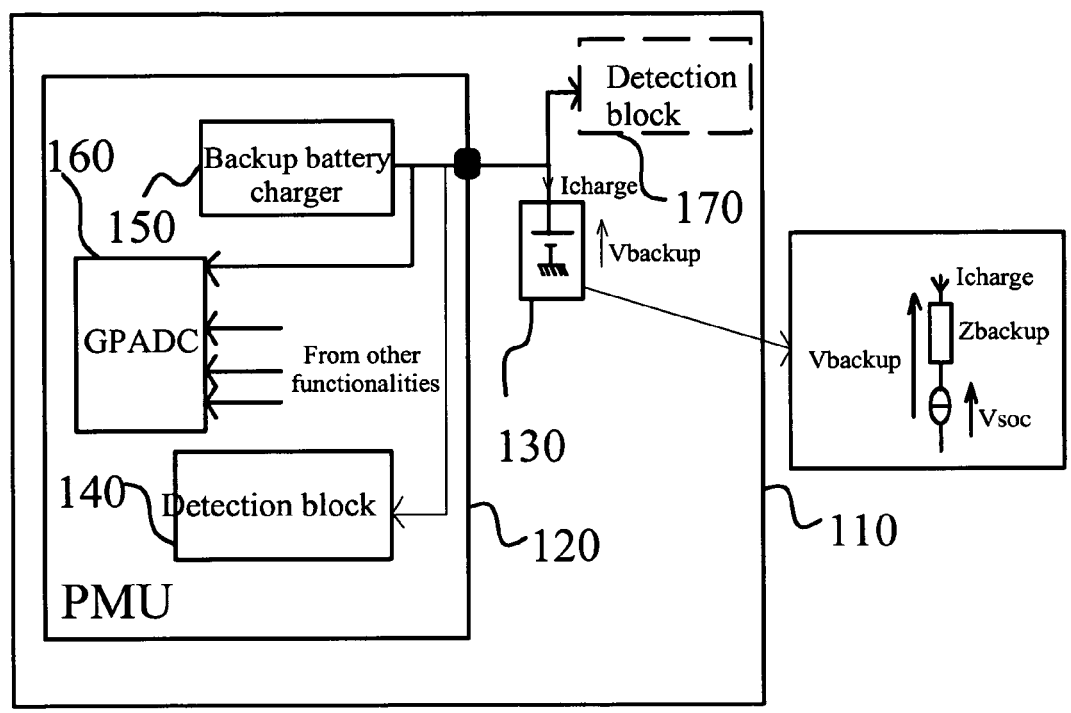
FIG. 3 shows the architecture of a product performing auto-test according to the invention.

FIG. 3 shows the structure of an electronic product or appliance 110 that incorporates one embodiment of the process described above.

The product 110 includes an electric double-layer capacitor 130 that is connected to a Power Management Unit 120, the latter including a backup battery charger 150, a detection block 140 and a General Purpose Analog to Digital Converter (GPADC) 160 for the measurement of the voltage of the electric double-layer capacitor 130.

It should be noticed that the PMU may take different forms and different levels of complexity. In some cases, the PMU may even incorporate a specific process which will be used for the execution of the process steps described below. Alternatively, the general purpose processor existing in the appliance may be used for that purpose . . . .

The product 110 further includes a detection block 170 connected to the electric double layer capacitor 130 for the purpose of detecting the value of the voltage generated by said battery, which voltage is forwarded by means of appropriate wires (not shown in the figure) to the GPADC 160, so that to make such information available to the processor.

The backup voltage Vbackup is given by the following formula:

$$V\text{backup}(t) = I\text{charge}(t) \times Z\text{backup}(t) + V\text{soc}(t) \quad (I)$$

where Vbackup(t) is a time function of the backup battery voltage;
Icharge(t) is a time function of the current that is provided by the backup battery charger 150 and is considered to be constant, which is for instance the case when charging is performed by a Constant Current Constant Voltage (CCCV) charging device. Indeed, as known by a skilled man a CCCV device performs both constant current charging and constant voltage charging, but during two different consecutives periods. In a first phase, the charging is performed with a constant current until the value of the backup battery reaches a predetermined value (eg 80% of the nominal value). Then, the CCCV charging device performs a constant voltage charging and keeps that as long as its voltage is superior to said threshold, so as to keep the value of the backup battery close to the nominal value. Clearly, this is one example of a charging device which can be used, but any other arrangement can be considered.
Zbackup(t) represents a time function of the internal impedance of the backup battery which, as mentioned above, shows a high value (typically 100 ohms). and
Vsoc(t) is the State Of Charge of the backup battery and in particular Vsoc(t) represents a time function of a backup battery voltage when there is no current drain through the latter. However, in the case of the electric double-layer capacitor 130 that is a fully discharged battery, Vsoc(t)=~0V.

Figure 4:
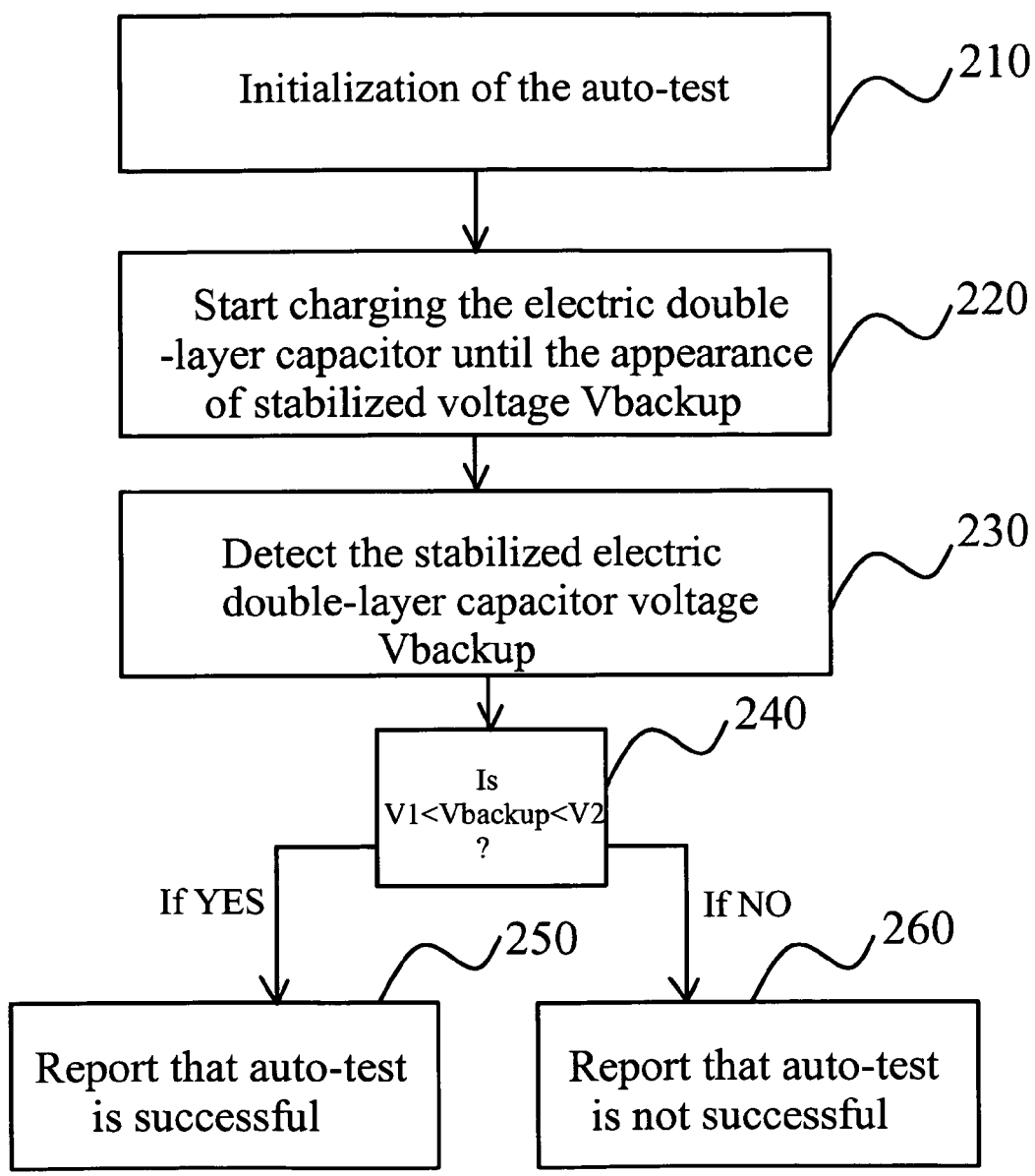
FIG. 4 illustrates a first embodiment of a process well suited to a fully discharged backup battery.
Figure 5:
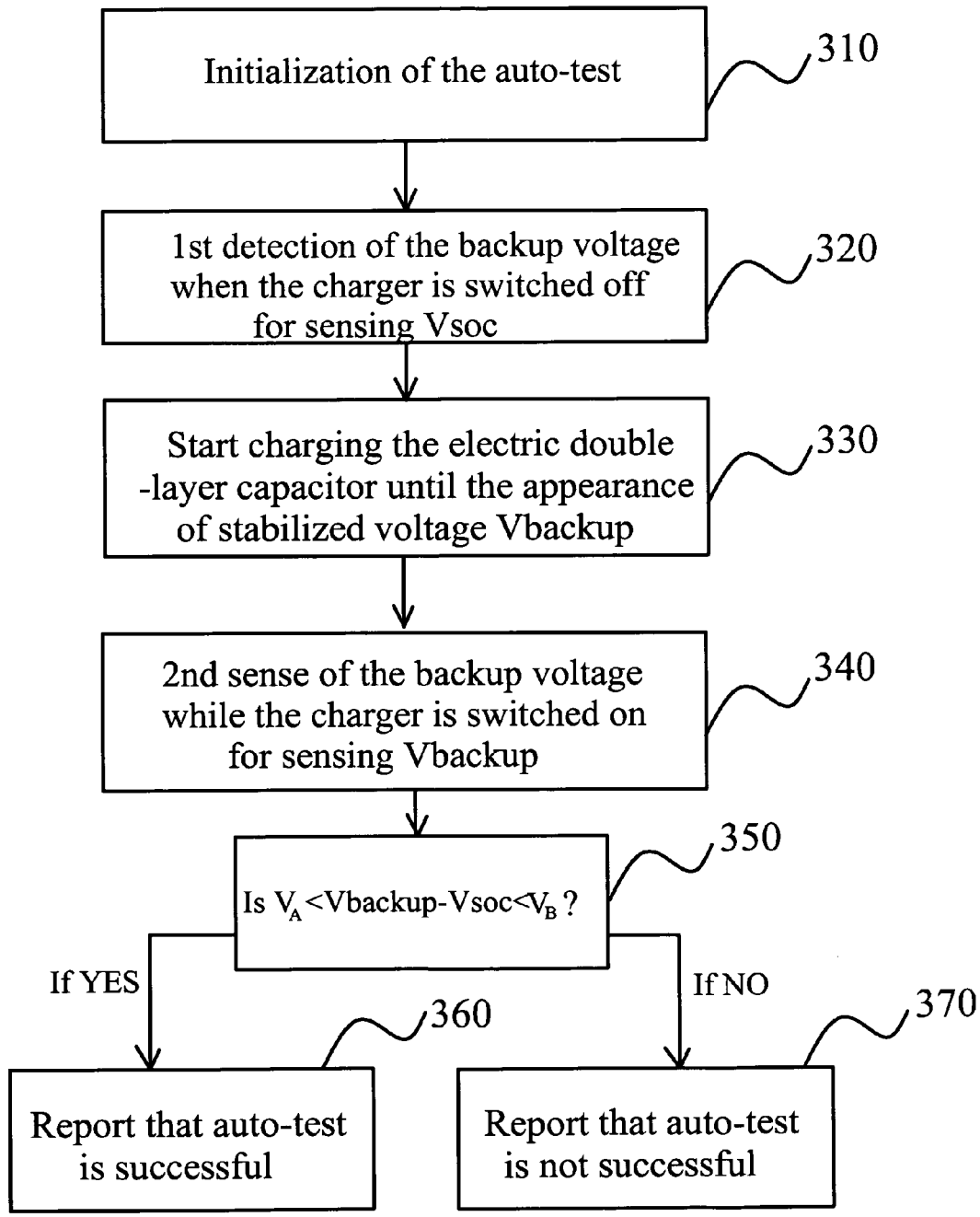
FIG. 5 illustrates a second embodiment of a process which can also be used for more conventional Lithium-Ion and Ni-Cad batteries.

With respect to FIGS. 3, 4, 5 there is now described the basic steps of the process for performing an auto-test to the double-layer capacitor 130 of the electronic product 110.

In a first step 210, the electronic product initializes the auto-test of the electric double-layer capacitor 130. During that step, the backup battery charger 150 is switched off.

The process then proceeds to a step 220, wherein the backup battery charger 150 is switched on so as to allow a current Icharge to flow from the latter to the electric double-layer capacitor 130 (see FIG. 3). The current Icharge is assumed to be constant.

Therefore, the charge of the electric double-layer capacitor 130 is started for a determined period which is chosen to ensure sufficient stabilization of both the current generated by the CCCV generator and the voltage appearing at the terminals of the backup battery, when being charged.

It has been discovered, and this is one significant advantage of the process which is described, that 1 ms is sufficient for allowing both establishing of the charging current and an appropriate measurement of the voltage of the battery.

Clearly, the skilled man may select other values which, in any cases, are significantly lower than the 600 ms required in the conventional auto-test process used for Lithium-Ion batteries.

Because of the high impedance (~100 Ohms) of the electric double-layer capacitor, a non negligible electric double-layer capacitor voltage (Vbackup) appears during the charging of the battery, which voltage can be sensed, in a step 230, by means of detection block 170 and also forwarded to the General Purpose Analog to Digital Converter 160 so as to be processed by an appropriate processor, be it the general purpose processor present in the appliance or, alternatively, the specific processor existing in the Power Management Unit 120.

GPADC converter 160 thus generates a digital representation of the analog voltage sensed on the backup battery, which is:

$$V\text{backup} = I\text{charge} \times Z\text{backup} + V\text{soc}(t)$$

As mentioned above, since the battery is assumed to be discharged, then Vsoc is 0V, so that the knowledge of Vbackup directly gives an estimation of the value of Zbackup, since the value of Icharge is known.

Then the process proceeds to a step 240, wherein a test is performed on either the value of the impedance or, more directly, on the value of Vbackup so as to determine whether the latter is comprised between two predetermined threshold values V1 and V2.

Generally speaking, the predetermined voltage values V1 and V2 are chosen by taking into consideration the sum of inaccurate parameters in the measurement path. Eg:
Charge current inaccuracy (% Icharge)
Backup battery impedance inaccuracy (% Zbackup)
Analog to Digital Converter measurement inaccuracy
If Vbackup is comprised between the predetermined voltage values V1 and V2, then the process proceeds to a step 250 wherein the auto-test reports a successful test.

In that case, the electric double-layer capacitor is presumed to work properly and it is well soldered.

Otherwise, if the value of Vbackup shows to be not comprised between the predetermined values V1 and V2, the process proceeds to a step 260 wherein the auto-test reports a battery failure.

In that case, the electric double-layer capacitor does not work properly and/or is not well soldered.

Particularly, if Vbackup is too high it means that the battery is either old or even, if Vbackup is equal to the power supply voltage, that no battery is present on the PCB.

With respect to FIG. 6, there will now be described a second embodiment of a process which can even be used for testing the more conventional Lithium-Ion or Ni-Cad batteries.

In a first step 310, the process proceeds with an initialization step. During that step, the backup battery charger 150 is switched off.

Then the process proceeds to a step 320 where a first detection of the voltage of the backup battery is being performed, so as to determined the value of Vsoc, without any current being drawn or injected within said battery.

Then the process proceeds to a step 330, wherein the backup battery charger 150 is switched on and a constant Icharge current is flown into the battery during a period which can be set, in one preferred embodiment, to a duration of approximately, to 1 ms.

After said period of 1 ms, the process then proceeds to a step 340 where the voltage value of the backup battery is sensed again, but still while being charged. The GPADC generates the digital representation and forwards the latter to the processor which can then perform, when appropriate, the computation of the impedance of the Lithium-Ion or Ni-Cad battery.

Then the process proceeds to a step 350, wherein a test is performed on the value of (Vbackup−Vsoc) (the former being sensed in step 340 while the latter was sensed in step 320), so as determine whether that difference is comprised between two predetermined threshold values $V_A$ and $V_B$. The particular values of $V_A$ and $V_B$ will be determined by the skilled man by taking into consideration various parameters, such as those mentioned above.

If (Vbackup−Vsoc) is comprised between the predetermined voltage values $V_A$ and $V_B$, then the process proceeds to a step 360 for reporting a successful auto-test. Conversely, the process reports a failure or a not present battery.

In the embodiments which were described above, the tests of step 240 and 340 are clearly performed by means of the processor which also executes the process described above. However, it should be clear that the skilled man may also perform the steps 240 and 340 by means of analog circuits, particularly operational amplifiers, wired for the purpose of performing the comparison with the thresholds values V1, V2, $V_A$ and $V_B$.

The invention claimed is:

1. A method of auto-testing a fully discharged battery of an electronic appliance that includes a battery charger, comprising:
performing an initialization phase;
charging the battery with a predetermined constant current during a predefined period having a duration that allows stabilization of the current;
detecting a voltage of the battery after the predefined period, while the battery is still being charged, wherein the detected voltage is calculated as:

$Icharge(t) \times Zbackup(t) + Vsoc(t)$, where Icharge(t) is the current at time t, Zbackup(t) is the internal impedance of the backup battery at time t, and Vsoc(t) is the state of charge of the battery at time t;
determining whether the detected voltage is within a predetermined voltage range; and
reporting a battery failure responsive to the detected voltage being outside the predetermined voltage range;
wherein the battery is a lithium-ion or nickel-cadmium battery, and wherein the method further comprises:
detecting a preliminary voltage of the battery after the initialization phase but before the charging has begun; and
subtracting the preliminary voltage from the detected voltage prior to the determining to obtain an adjusted voltage, such that the determining comprises determining whether the adjusted detected voltage is within the predetermined voltage range, and the reporting comprises reporting a battery failure responsive to the adjusted detected voltage being outside the predetermined voltage range.

2. The method of claim 1, wherein the fully discharged battery is an electric double-layer capacitor used as a backup battery in the electronic appliance.

3. The method of claim 1, wherein the electronic appliance also includes a processor, and a General Purpose Analog-to-Digital Converter (GPADC) configured to convert the detected voltage into a digital signal and transmit the digital signal to the processor.

4. The method of claim 3, wherein the GPADC is part of a Power Management Unit of the electronic appliance.

5. The method of claim 1, wherein the predefined period is approximately 1 millisecond.

6. The method of claim 1, further comprising:
reporting that the battery is absent responsive to the detected voltage being equal to a voltage of a power supply of the electronic appliance.

7. A circuit for auto-testing a fully discharged battery of an electronic appliance that includes a battery charger, the circuit being configured to:
perform an initialization phase;
charge the battery with a predetermined constant current during a predefined period having a duration that allows stabilization of the current;
detect a voltage of the battery after the predefined period, while the battery is still being charged, wherein the detected voltage is calculated as:

$Icharge(t) \times Zbackup(t) + Vsoc(t)$, where Icharge(t) is the current at time t, Zbackup(t) is the internal impedance of the backup battery at time t, and Vsoc(t) is the state of charge of the battery at time t;
determine whether the detected voltage is within a predetermined voltage range;
and report a battery failure responsive to the detected voltage being outside the predetermined voltage range;
wherein the battery is a lithium-ion or nickel-cadmium battery, and wherein the circuit is further configured to:
detect a preliminary voltage of the battery after the initialization but before the charging has begun; and
subtract the preliminary voltage from the detected voltage prior to the determining to obtain an adjusted detected voltage, such that circuit is configured to determine whether the adjusted detected voltage is within the predetermined voltage range, and report a battery failure responsive to the adjusted detected voltage being outside the predetermined voltage range.

8. The circuit of claim 7, wherein the fully discharged battery is an electric double-layer capacitor used as a backup battery in the electronic appliance.

9. The circuit of claim 7, wherein the appliance includes a processor, and a General Purpose Analog-to-Digital Converter (GPADC) configured to convert the sensed voltage into a digital signal and transmit the digital signal to the processor.

10. The circuit of claim 9, wherein the GPADC is part of a Power Management Unit of the electronic appliance.

11. The circuit of claim 7, wherein the predefined period is approximately 1 millisecond.

12. The circuit of claim 7, wherein the circuit is further configured to:
report that the battery is absent responsive to the detected voltage being equal to a voltage of a power supply of the electronic appliance.

* * * * *